(12) United States Patent
Crick

(10) Patent No.: US 7,710,122 B2
(45) Date of Patent: May 4, 2010

(54) GROUND RESISTANCE TEST APPARATUS

(75) Inventor: Robert Crick, Rancho Santa Fe, CA (US)

(73) Assignee: Greenlee Textron Inc., Rockford, IL (US)

(*) Notice: Subject to any disclaimer, the term of this patent is extended or adjusted under 35 U.S.C. 154(b) by 36 days.

(21) Appl. No.: 11/977,622

(22) Filed: Oct. 25, 2007

(65) Prior Publication Data

US 2008/0100282 A1 May 1, 2008

Related U.S. Application Data

(60) Provisional application No. 60/854,285, filed on Oct. 25, 2006.

(51) Int. Cl.
*G01R 31/14* (2006.01)
*G01R 31/08* (2006.01)
*G01R 31/02* (2006.01)

(52) U.S. Cl. .................. 324/509; 324/525; 324/541

(58) Field of Classification Search .............. 324/509, 324/522, 525, 541
See application file for complete search history.

(56) References Cited

U.S. PATENT DOCUMENTS

| | | | | |
|---|---|---|---|---|
| 4,153,923 A | * | 5/1979 | Graf | 361/48 |
| 4,866,391 A | * | 9/1989 | Latham, Jr. | 324/509 |
| 5,189,375 A | * | 2/1993 | Tuttle | 324/537 |
| 5,218,616 A | * | 6/1993 | Stephens | 379/29.05 |
| 5,302,905 A | * | 4/1994 | Crick | 324/613 |
| 5,515,218 A | * | 5/1996 | DeHaven | 361/45 |
| 6,396,284 B1 | * | 5/2002 | Tisdale et al. | 324/525 |
| 6,590,962 B1 | * | 7/2003 | Groessl et al. | 379/14.01 |
| 6,940,949 B2 | * | 9/2005 | Forsberg | 379/21 |

* cited by examiner

*Primary Examiner*—Amy He
(74) *Attorney, Agent, or Firm*—Trexler, Bushnell, Giangiorgi, Blackstone & Marr, Ltd.

(57) ABSTRACT

The "Ground Resistance Test" provides a circuit and test setup for measuring the resistance of earth grounds. The ground resistance test uses the central office battery from a working telephone pair to source current into the "Tested Ground". First the quiescent voltage (Vo) on the Tested Ground with respect to a removable ground rod is measured and recorded. Then the ring side of a working pair is connected to the Tested Ground and the office battery draws current (I) from the Tested Ground. The voltage (Vi) on the Tested Ground with respect to the removable ground rod is again measured with dc current flowing. Voltage fall Vf is computed as (Vi–Vo). The ohms (R) of the Tested Ground is then displayed as R=Vf/I. In the event that central office battery is unavailable, the Ground Resistance Tester will provide an optional current rod and internal battery source.

18 Claims, 2 Drawing Sheets

GROUND RESISTANCE TEST APPARATUS

RELATED APPLICATIONS

This application claims the benefit of U.S. provisional application Ser. No. 60/854,285 filed on Oct. 25, 2006, which is herein incorporated by reference.

BACKGROUND OF THE INVENTION

The present invention relates generally to a method and means for accurately measuring the resistance of the cable shield and the resistance of earth grounds, power grounds, station grounds and ground bonds along telecommunications cables and particularly telephone cables in the field.

Good grounding of telephone cable shields and subscriber station grounds is required for safety and noise free reception of the voice or data being sent over the lines. When shielding is impaired, the technician must be able to accurately measure the ground resistance and shield resistance at cabinets, accesses and splices along the cables, to facilitate locating and repairing the poor shield bonding and grounding. He must also be able to accurately measure the subscriber station ground resistance to verify it is below the specified maximum of 25 ohms.

Internet Protocol Television, IPTV, and "triple play" services are now being deployed by AT&T and others over existing copper telephone pairs from in a Fiber-To-The-Node, FTTN system. In AT&T's system these nodes have "VRAD" gateways located next to existing cross-connect boxes already in the Telephone Outside Plant (telephone distribution cables). The VRAD is fiber-fed and provides high speed Internet Protocol data over the existing copper distribution cables in the "last mile" to the subscriber premise. In the present scheme the existing POTS, Plain Old Telephone Service, coming through the "feeder" cables from the Central Office to the cross-connect box, is sent through a splitter in the VRAD which combines the POTS with the VDSL, Very high speed Digital Subscriber Line. Then, both travel together to the subscriber.

IPTV is very sensitive to induced transients from nearby power lines and to short wave radio interference such as Ham Radio. To prevent such interference from entering the cable, the cable shields must be bonded through with low resistance connections from the VRAD to the subscriber. To test these shields for proper grounding, a test set must be able to read out ohms accurate down to one ohm. One also must be able to test along the cable without opening the splices for pair access. Thus, there is a need for a "Ground Resistance Test" to be used by maintenance technicians that reads directly in ohms and does not require pair access and a station ground verifier to be used by Premise Technicians.

The planned deployment of VoIP (Voice over Internet Protocol) over the VDSL links will allow the POTS lines from the central office "CO" to be disconnected. After this time, no office battery will be available for station ground verification or for the Ground Resistance Testing at the premise.

Various attempts have been made to overcome these problems. A conventional 2 terminal ohmmeter is not effective for verifying good shield grounding. The frequent presence of significant AC and DC voltages on the shields can render the ohms readings inaccurate, and it is difficult to be sure you have a good reference ground. The first lead of the ohmmeter is connected to the ground being measured, and the second lead is connected to a reference ground, frequently the cabinet ground or the shield of another cable or the MGN (Multi Ground Neutral of nearby power distribution) when available. A removable ground rod driven in the grass cannot be used for a two terminal measurement because a ground rod of manageable length will usually have resistance to earth above the 25 ohm minimum allowed reading for a Station Ground. Accurate ground resistance measurements down to 1 ohm are required to troubleshoot bonding along the feeder and distribution cables. If there is any resistance in the ground used as a reference, it will add to the resistance of the ground being measured. This added resistance frequently confuses the technician. For example 100 ohms in his reference ground can be falsely attributed to the shield resistance being measured, causing the technician to dig to open a buried splice that has perfectly adequate grounding. Earth salts can also interact with dissimilar metals in ground rods to create a battery affect that can cause conventional DC ohmmeters to peg out, making their readings unusable. As a result it is not recommended that a conventional ohmmeter be used to test shield grounding.

Multifunction Subscriber loop test sets such as the 3M 965 or Fluke 990 CopperPro include a Station Ground measurement based on a computation off the change in loop current when terminated Tip-Ring as compared to that when terminated Ring-Ground. The Ring-Ground termination eliminates half the pair loop resistance so a ballpark estimated ground resistance can be computed from the amount of increase of loop current. Unfortunately this test is not very accurate, and it is very inaccurate when the CO switch is a Lucent 5ESS with a floating ground battery. Most of the switches in the US are 5ESS so this test is normally not useful for measuring ground resistance.

Dedicated "Ground Resistance Testers" (three or four terminal ohmmeters) can give more accurate readings of ground resistance. These meters use two or three removable ground rods driven in the grass to allow measurement of the resistance of a Tested Ground without the resistance of the removable ground rods adding to the reading. These testers are more expensive than ohmmeters used by telephone technicians and are used infrequently. So only a small number of ground testers are purchased per work center. Substantial training is required as correct ground rod placement is required for accurate readings, and the meters are usually passed around without training, resulting in untrained personnel getting inaccurate readings. Thus, there is a need for an accurate ground resistance tester that is compatible with normal telephone technician troubleshooting procedures.

Ground resistance testers are available that use an inductive clamp to measure ground resistance. These testers have an advantage in that it is not necessary to disconnect shield ground bonds to get a reading. However, these testers are subject to problems similar to those of a two terminal ohmmeter in that any resistance in the reference ground adds to the measured resistance. Since cable shields are grounded at multiple points it is difficult to tell whether the measured resistance is in a ground being tested or in the connected cable shields, and it does not tell in which direction a measured open is located. Though this test is useful, it does not satisfy the need for a ground resistance test.

A method used by a few US Telephone Companies to test grounding applies current from Central Office battery to the Tested Ground and measures voltage potential fall (voltage drop) on that ground with respect to earth due to the current flow. A DC voltmeter is connected between a removable ground rod placed away from local grounding and the ring side of an idle working telephone pair. The voltmeter will thus display −48 to −52 Volts of office battery with respect to earth. Leaving the voltmeter connected, the ring conductor is then touched to the ground being verified. If the ground "kills" the voltage to below −1 Volt, the ground is deemed "good" (below 25 ohms to earth). The above 1 Volt value is based on current being sourced Ring to ground by the Central Office switch, typically 40 mA. 40 mA times 25 ohms=1 volt. This typical office current can vary from 20 mA to above 100 mA due to pair loop resistance and CO switch type so this test is very inaccurate and cannot measure below 25 ohms. Measurements to one ohm are needed to troubleshoot shield grounding and bonding.

Thus a means for simply measuring ground resistance is needed that is accurate, less expensive, more intuitive, and requires little training. This unit would measure ground resistance or verify station grounds and shield grounding at any access along the cable. The ohms readout could be used by maintenance technicians and a go/no-go indication could be used by entry level premise technicians wiring homes for VDSL and IPTV.

Measurement of ground resistance with a classic two terminal ohmmeter will frequently give erroneous readings, which cause lost time when looking for open shields. Commercially available Ground Resistance Testers require the use of two removable ground rods, and accurate measurements depend on the correct location of the two rods. Operation of these testers is beyond the scope of the training a typical telephone technician receives. Therefore, there is also a need for a test that falls within the normal training of telephone technicians, is easy to use, and can be included in his multi function test set.

SUMMARY OF THE INVENTION

The present invention makes use of battery voltage on a telephone pair in the cable along with a single removable ground rod to achieve an accurate ground resistance measurement. Means is also provided for providing an internal battery, also referred to as power supply, and a second "current rod" when the central office "CO" battery is unavailable. The ground resistance measurement is displayed in ohms for maintenance technicians and in a go/no-go format based on a maximum resistance threshold for station ground verification by premise technicians. To minimize the training required, the "Ground Resistance Test" of the present invention is particularly compatible with the procedures used by telephone technicians in the normal exercise of their duties.

The "Ground Resistance Test" provides a circuit and test for measuring the resistance of earth grounds including power ground attachments, ground rods and cable shield bonding resistance, that is adapted well to the procedures followed by telephone technicians in their day-to-day work environment. Therefore, the test will use the telephone pair wherever possible to eliminate complicating connections that are not familiar to the telephone technician, or that may not be easily available in his work environment.

The ground resistance test of the present invention uses the office battery, also referred to as a central office DC power supply, from a working telephone pair to source current into the "Station Ground" or "Tested Ground", and measures the voltage fall produced on that ground with respect to earth by that current. This voltage fall is then used to compute the resistance to earth of that Tested Ground. The ohms can be displayed numerically as would be required by a Maintenance Technician. The term "verifier" designates a go/no-go LED indication of the quality of a Station Ground for Premise Technicians. The circuits of the present invention can be built into a standalone tester, or built into a multifunction Subscriber Loop Test Set to allow maintenance technicians to perform the test as part of their routine.

The present invention uses central office battery voltage from a working pair to drive current into the Tested Ground. First, the quiescent voltage (Vo) on the Tested Ground with respect to a removable ground rod is measured and recorded. Then, the ring side of a working pair is connected to the Tested Ground and office battery draws current (I) from the Tested Ground. The voltage (Vi) on the Tested Ground with respect to the removable ground rod is again measured with DC current flowing. Voltage fall Vf is computed as (Vi−Vo). The ohms (R) of the Tested Ground is then displayed as R=Vf/I.

Unfortunately, VoIP lines lack a supply of current from a Central Office Battery. Also, since VoIP lines are generally not terminated to ground at the VRAD, a place from which to separately source current to the Tested Ground must be provided. The present invention overcomes these obstacles by providing an internal battery current reference for testing utilizing a second "current rod". This current rod must be located away from the voltage rod. Typically, the Ground Resistance Tester will utilize this optional current rod only when pair battery access is inconvenient.

The herein described Ground Resistance Tester can include a second removable ground rod, termed current rod herein, for sourcing current into the Tested Ground from an internal battery. This separate Current rod is needed to prevent corrupting the Tested Ground or the Voltage Rod by the Current rod's voltage Rise, and it is placed a minimum distance from the other two grounds. Having this Current rod will allow the tester to be used where no pair is available or where the pairs do not have POTS battery, such as VoIP circuits.

When C.O. battery is not available, internal battery source 54 is utilized. The negative side of the internal battery is connected to instrument ground, which is externally connected to the Tested Ground by a test clip. The positive terminal of the battery is connected through a current limiting resistor and through a control switch to the Current Rod. The switch is used to apply or remove test battery current sourced through a limiting resistor from the Current Rod to the Tested Ground.

To perform the test with the current rod, the voltage between the Tested Ground and the Voltage Ground is measured. Then the switch is closed thereby supplying internal battery test current into the Tested Ground. Thereafter, the above voltage is re-measured. The current through the current sense resistor is also measured. The difference between the two voltages and the current flow is used to compute the resistance of the Tested Ground.

Admittedly, a disadvantage of this second ground rod (current rod) is that it must be placed a proper distance from both the Tested Ground and the Voltage Rod. This can be difficult in paved areas, and is susceptible to mistakes in placement which will cause incorrect readings. Furthermore, this concept might be too advanced for the entry level "Premise Technician", and provision for the current rod could be excluded from the verifier version if desired. Nevertheless, it would be necessary for Maintenance Technicians when they have to do shield ground tests along the cable where pair access is difficult.

DETAILED DESCRIPTION OF PREFERRED EMBODIMENTS

Figure 1:
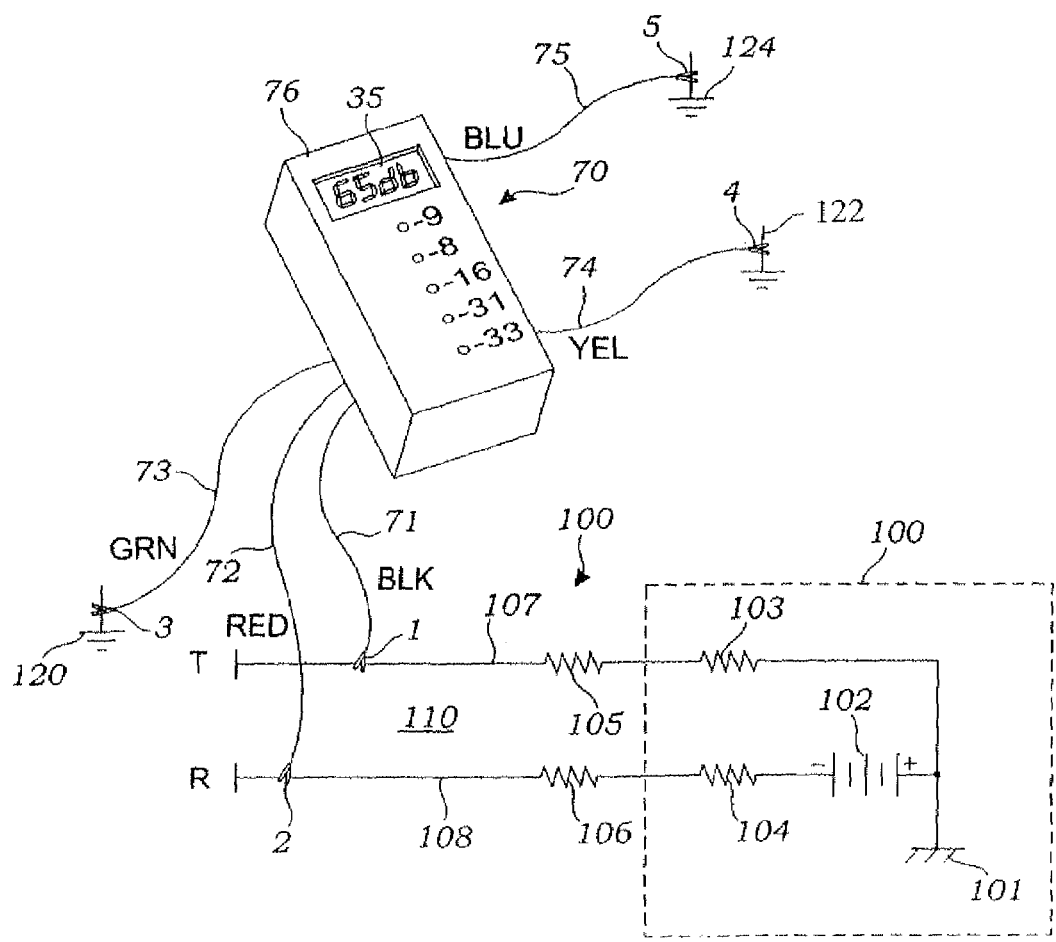
FIG. 1 is a perspective view of a hand-held apparatus in which the present invention can be incorporated.

While the present invention is susceptible of embodiment in various forms, as shown in the drawings, hereinafter will be described the presently preferred embodiments of the invention with the understanding that the present disclosure is to be considered as an exemplification of the invention, and it is not intended to limit the invention to specific embodiments illustrated.

The present invention is described below in the preferred embodiments with reference to a paired telephone line. However, it is understood that the invention is applicable to substantially any paired line and more particularly to any paired telecommunications line. It is further understood that the present invention is applicable to a paired line in isolation or a paired line contained within a paired cable. It is further understood that the present invention is particularly applicable to a paired line having a source of DC battery, but it is also applicable to paired lines that do not have a source of DC battery. It is further understood that ground resistance in ohms can be displayed for maintenance technicians, and a go/no-go LED type indication can be provided for premise technicians within the scope of this invention.

Referring first to FIG. 1, the ground resistance tester 70 includes a housing 76 and a display 35 including LEDs and/or a liquid crystal display for visually displaying measured ohms values to an operator. The tester further includes leads 71, 72, 73, 74, 75 which are wires extending exteriorly from housing 76. Each of the leads terminate with contacts, with leads 71-75 having contacts 1-5 affixed thereto. Contacts 1, 2 are removably connectable to conductors 107, 108 of the paired line designated generally as 110. Ground lead 73 also has a ground contact 3 affixed which is engaged to Tested Ground 120. Contacts 1, 2, 3, 4, 5 are preferably conventional alligator clips. Also preferable, each of the wires leading to contacts 1-5 are insulated with materials of different colors to assist the technician in differentiating the various leads. For example only, as illustrated in FIG. 2, the wires leading to contacts 1-5 are coated in colors black, red, green, yellow and blue, respectively.

Figure 2:
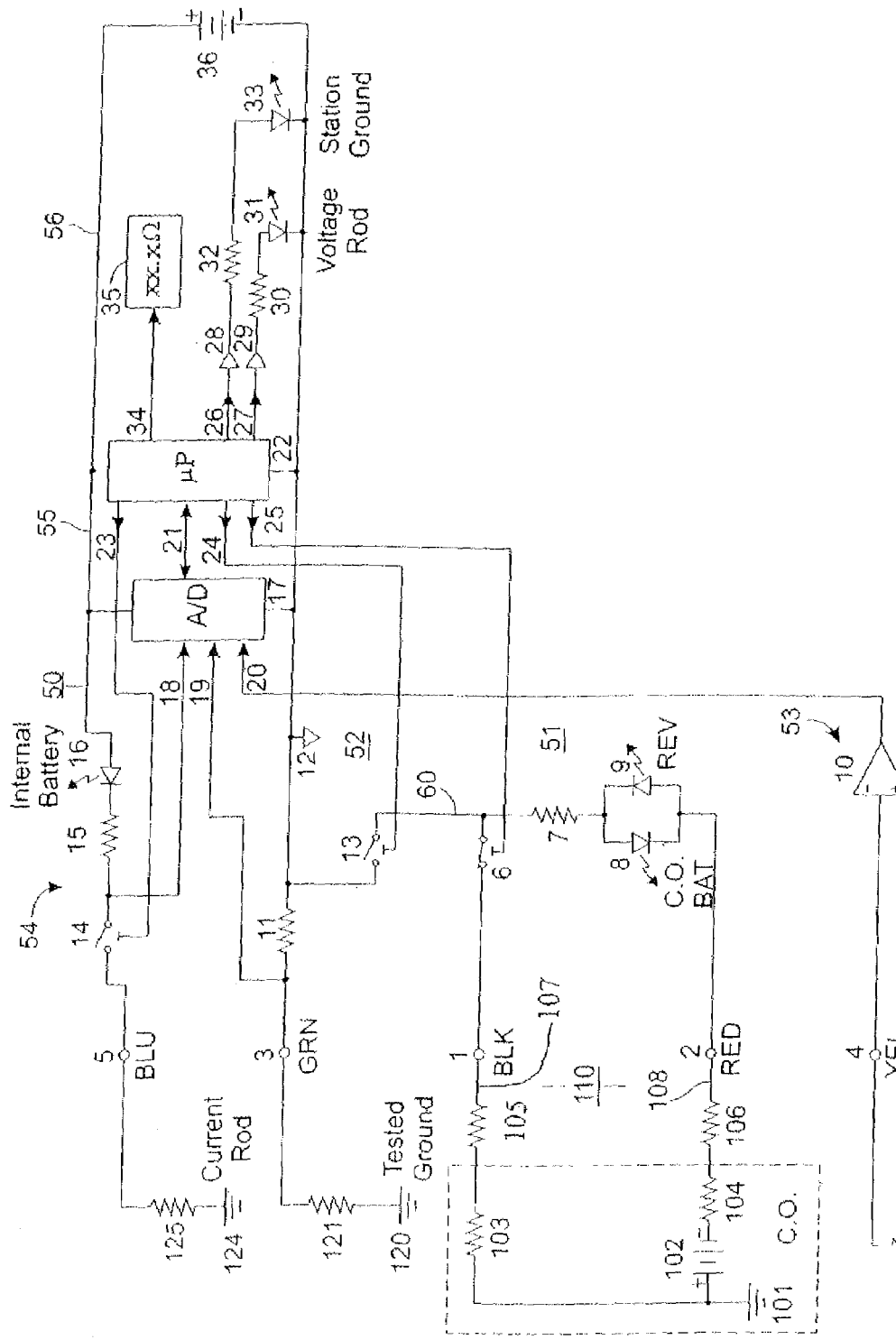
FIG. 2 is a diagram of the circuitry of the present invention.

Referring now to FIG. 2, the internal circuit of device 70 is shown and generally designated 50. Internal circuit 50 comprises line termination 51, current shunt 52, earth voltage sensor 53, internal battery source 54, processor 55, and display 56. A Battery 36, preferably a conventional 9V battery, is connected to power the electronics.

The circuit of the present invention includes a line termination 51 in which contact 1 connects to switch 6, shown closed, thus closing the path to resistor 7. Resistor 7 connects to LEDs 8 and 9 shown connected in opposed parallel. The paralleled LEDs 8 and 9 then connect to terminal 2 completing the path allowing current from the CO battery to flow from contact 1 through line termination 51 to contact 2. LED 8 is illuminated by this normal current flow. Resistor 7 is preferably 430 ohms, the standard termination for measuring loop mA on a pair. Should contacts 1 and 2 be accidentally reversed when connected to pair 110, LED 9 will illuminate notifying the technician to reverse the pair to allow normal testing.

As seen in FIG. 2, the circuit includes a current shunt 52 including conductor 60 which connects switch 13 to line termination 51 between switch 6 and resistor 7. When the processor 55 performs a ground resistance test, it opens switch 6 and closes switch 13 which causes battery current to be drawn from the Tested Ground 120 via contact 3, resistor 11, switch 13, resistor 7, LED 8, and terminal 3 to the Ring side of the pair 110. Resistor 11 is a current sense resistor, preferably 1 ohm, and current through it causes a voltage drop that makes contact 3 positive with respect to circuit reference 12. The voltage at contact 3 appears at analog-to-digital converter A/D 17 via conductor 19 to inform the processor 55 of current flow. Resistor 121 represents the resistance in the Tested Ground and the battery current will produce a voltage drop in that resistance, which voltage will cause contact 3 to become negative with respect to the earth surrounding Tested Ground 120.

Meanwhile, the circuit's earth voltage sensor 53 includes contact 4 which is connected to a removable voltage rod 122 placed in the earth some distance away from the Tested Ground. Amplifier 10 input connects to contact 4 and its output via conductor 20 to an input of the A/D 17, and it acts to create a high impedance voltage monitor that draws minimal current. As a result, resistance to earth in the voltage rod represented by resistor 123 can be high, typically up to 100 k ohms, as would occur in very dry sandy soil, without affecting the reading.

The circuit's processor 55 is comprised of A/D converter 17 and microprocessor 22. Inputs to the A/D 17 include conductor 18 which monitors voltage on the current rod 124, conductor 19 which monitors current through resistor 11, and conductor 20 which monitors voltage on the voltage rod. The microprocessor 22 communicates with the A/D converter 17 via the bidirectional bus 21 to select measurements and receive voltage and current information. Microprocessor 22 outputs are conductor 23 to control switch 14, conductor 24 to control switch 13, conductor 25 to control switch 6, conductor 26 to control LED 33 through buffer 28 and resistor 32, and conductor 27 to control LED 31 via buffer 29 and resistor 30. Output buss 34 controls LCD display 35.

Continuing with FIG. 2, with reference to display 56, ground ohms are displayed on LCD 35 along with messages indicating corrective actions related to lead connection and ground rod quality. In addition, LEDs are shown which provide indications of REVERSED (LED 9), PAIR (C.O.) BATTERY (LED 8), INTERNAL BATTERY (LED 16), VOLTAGE ROD (LED 31), STATION GROUND (LED 33) in a Station Ground Verifier as shown in FIG. 1. The threshold standard for the good/bad station ground resistance is presently 25 ohms and this can be changed in processor firmware if standards change. The function of these LEDs can be replaced by messages on the LCD Display, removing them from the Ground Resistance Tester front panel shown in FIG. 1.

Referring now to FIG. 1, the LEDs on the front of the external view represent the go/no-go function of a Station Ground Verifier. If the LCD display is removed, this function is achieved by the LEDs utilizing the same circuits described in FIG. 2. This device is intended for the premise technician who wires up the residence for IPTV service. Premise technicians are not trained to understand ohms readings and as such require go/no-go indications such as shown. These go/no-go indicator icons can also be presented on a simplified LCD display such as that of the premise technician's VDSL go/no-go tester and the features of the present invention could be combined into such a unit.

To initiate an automated four lead verifier circuit for ground resistance testing, one connects contacts 1 and 2 to the conductors of an idle working pair. Contact 1 is removably connected to the Tip side 107 of the designated pair which returns to ground in the CO, and contact 2 is removably connected to the Ring side 108 of the designated pair which returns to CO battery as shown in FIG. 1. Thereafter, contact 3 is removably connected to the Tested Ground 120 (any local ground to be tested), and contact 4 is connected to removable voltage rod 122. Once the four leads have been connected, the microprocessor is programmed to first set switch 6 to the closed position placing the termination across the pair and to measure the voltage between the Black (contact 1) and Yellow (contact 4) leads. If the DC voltage is within limits, it verifies the removable ground rod is connected by illuminating the Red LED.

Then the ground tester measures and records the DC Offset voltage between the Green (contact 3) and Yellow (contact 4) leads. Line termination 51 connects between contacts 1 and 2 and serves to draw loop current from CO battery 102 via the connected pair 110. Current shunt 52 acts to open switch 6 to remove loop current from the Tip side of the pair and close switch 13 to draw current through resistor 11 and terminal 3 from earth via the Tested Ground 120 thus developing voltage in the resistance 121 of the Tested Ground. The voltage drop in the Tested Ground resistance is monitored by earth voltage sensor 53 via voltage rod 122 connected to terminal 4, then sent to the analog-to-digital converter (A/D) 17 in processor 55.

The internal switches are controlled by the internal microprocessor which alternates the switches (relays) between the two positions. In the normal position, the DC offset between the Tested Ground and the removable ground rod is measured with no loop current flowing into the Tested Ground, and the offset is recorded. When the switches are in the second position, DC loop current flows through the Tested Ground and the current flow is measured and recorded. The DC voltage between the removable ground rod and the Tested Ground is again measured. The previous offset is subtracted out to get the corrected DC voltage fall on the Tested Ground. This voltage is divided by the current to compute ohms in the Tested Ground.

More specifically, the processor switches the relay to place the termination between Ring and Station Ground, so Ring conductor current flows through the termination from the Station Ground and the processor re-measures the DC voltage between the Yellow (contact 4) and Green (contact 3) leads and subtracts the previous DC Offset reading to obtain Station Ground voltage fall, V. The processor then measures voltage across and computes current in the 25 ohm resistor. This current also flows into the Station Ground, so Station Ground ohms can be computed as R=V/I.

In a first go/no-go verifier embodiment, the ohms are compared to the limit value (25 ohms in previous case), and the Red LED 33 is illuminated by the processor when the ohms limit is exceeded. Alternatively, a digital display can be added to display ohms or other desired information. The processor can run several tests in sequence to verify proper loop mA, and the removable ground rod connection.

The ground resistance verifier is particularly suitable for technicians having little training. In such circumstances, it is preferred that the ground resistance tester 70, shown in FIG. 1, include go/no-go LEDs for indicating whether the setup and ground resistance is adequate. Advantageously, the test set-up is simple requiring only the technician instructions presented as follows. Normally the ground resistance verifier will not include a current rod 124.

1. First connect the leads to an idle working pair
   a. Red Clip to Ring.
   b. Black Clip to Tip.
   c. Green Clip to the Station Ground.
   d. Yellow Clip to a removable ground rod driven in the grass.

2. Verify the chosen pair is connected properly, and that the removable ground rod is good:
   a. The OFFICE BATTERY Green LED should illuminate indicating loop current is flowing Tip to Ring on the pair.
   b. The BAD GROUND Red LED will also illuminate indicating the Black lead is not connected to a good ground. The Tip conductor in this case is not a good ground as its voltage falls below −1 Volt.
   c. NOTE—If this LED does not illuminate here, check the removable voltage rod connection. The ground test below will not be valid until the LED illuminates in this test.
   d. The REVERSED Yellow LED will light if the Tip and Ring are reversed. If so exchange the Red and Black leads and recheck for above indications.

3. After the above test verifies a good removable ground rod, the processor will test and verify Station Ground or any other Tested Ground:
   a. The processor will switch to terminate the pair Ring to Ground and perform the Station Ground Test.
   b. The OFFICE BATTERY Green LED 8 should remain illuminated indicating loop current is flowing through the Tested Ground. If the ground is open this LED will not illuminate.
   c. The BAD GROUND Red LED 33 should go out indicating the Green lead is connected to a ground below 25 ohms to earth. If this Red LED remains lit, the Tested Ground is defective.

For the technician performing the field ground test described in these technician instructions, first the leads are connected as shown in FIG. 1 to measure the resistance of Tested Ground 120. One connects contacts 1 and 2 to a working pair, with contact 1 (Blk) to Tip and contact 2 (Red) to Ring. Then one connects contact 3 (Gm) to the Tested Ground. Contact 4 (Yel) is connected to a voltage rod removably placed in the grass away from the Tested Ground. The circuit will cycle between terminate and test states. First the processor will close switch 6 and open switch 13 and switch 14. This terminate state places resistor 7 across the pair through LED 8, which will light if battery is present. If LED 9 lights, the pair is reversed and so the technician must reverse leads 1 and 2 before proceeding. The processor will read and record the voltage rod offset voltage in this terminate state. This voltage must be subtracted, as described below, to correct for DC voltage offsets present between the household electric ground and earth or between local telephone cable shield ground and earth, or for small galvanic voltages produced by interaction between the metal of the Voltage Rod and the soil. These voltages can be large enough to give a substantial error in the ohms value computed for display, or of the ohms trip point in the case of a verifier.

The processor next will open switch 6 and close switch 13, leaving switch 14 open. This shunt state will cause loop current to flow from Tested Ground 120 through contact 3, current sense resistor 11, switch 13, resistor 7, LED 8, and contact 2 and into the Ring conductor 108. LED 8 will remain lit unless the ground is high ohms. The processor will read the current through resistor 11 and the voltage on the voltage rod at contact 4. It will subtract the offset voltage from above and divide the current into the difference voltage to obtain the ohms of the Tested Ground which it will send to the display. Preferably, the tester will periodically, such as about once per second, switch back to the terminate state and repeat the measurement cycle to update the ohms reading.

In case there is no voltage on the pair, no current will be sensed to ground so the processor will display a message to connect the current rod, then to engage internal battery source 54 it will open switch 13 and close switch 14. The processor will now measure the current through resistor 11 and voltage on voltage rod contact 4, and open switch 14 and re-measure offset subtract and re-compute ohms. The processor will measure voltage on conductor 18 and see if it is within limits to validate the ohms reading before displaying it. It will also validate the current on conductor 19 and the voltage on conductor 20 are within limits in both the shunt and terminate states before displaying ohms.

Infrequently, locations may be encountered where ground resistance must be measured but no pairs with office battery are available. In this case, the present invention has internal battery source 54 available to allow performance of the Ground Resistance Test. To accomplish this test when no CO battery is available, a second rod termed the "current rod" must be placed in the earth away from both the Tested Ground and the voltage rod. Preferably, the processor is programmed to notify the technician when this rod is needed and to automatically switch to send current from the internal battery to the current rod when no current is available from the pair. Since technician time is consumed in finding a proper location to place this current rod in relation to the voltage rod and the Tested Ground, this current rod is connected and used only when required. When the processor opens switch 6 and closes switch 13 for a ground resistance test, if inadequate current flow is sensed by resistor 11, the processor notifies the technician to connect the current rod, then opens switch 13 and closes switch 14. When the technician places the current rod and connects it to contact 5, a path is created from the positive (+) terminal of internal battery 36 through LED 16, resistor 15, switch 14 to contact 5 and into the current rod to earth. To complete the circuit current flows out of the Tested Ground through contact 3, resistor 11, into circuit ground and to the negative (−) terminal of battery 36. Resistor 15 preferably is 1000 ohms.

The circuit and test method provide means for accurately measuring the resistance of the cable shield and the resistance of earth grounds, power grounds, station grounds and ground bonds along telecommunications cables and particularly telephone cables in the field. While several particular forms of the invention have been illustrated and described, it will be apparent that various modifications can be made without departing from the spirit and scope of the invention. Accordingly, it is not intended that the invention be limited except by the following claims.

I claim:

1. A circuit for measuring resistance to ground on a telecommunications paired cable including a designated telephone pair having a tip side and a ring side in communication with a central office power supply, said circuit comprising:
 a first electrical lead for connecting to a ground to be tested;
 a second electrical lead for connecting to the ring side of the designated pair which returns to a central office power supply;
 a third electrical lead for connecting to the tip side of the designated pair which returns to a central office ground;
 a fourth electrical lead for connecting to a voltage rod removably inserted into the ground;
 a switch connection including a first condition where loop current is not flowing from the central office power supply to the ground to be tested and including a second condition where loop current flows from the central office power supply to the ground to be tested;
 a first measurement means for providing a first DC voltage measurement of voltage between the first lead connected to the ground to be tested and the fourth electrical lead connected to the voltage rod when the switch connection is in the first condition and a second DC voltage measurement of voltage between the first lead connected to the ground to be tested and the fourth electrical lead connected to the voltage rod when the switch connection is in the second condition;
 a second measurement means for providing a measurement of current flowing from the first electrical lead connected to the ground to be tested to the second electrical lead connected to the ring side of a designated pair which returns to a central office power supply when the switch connection is in the second condition;
 a processor means for subtracting the second DC voltage measurement from the first DC voltage measurement to provide a station ground voltage fall;
 a processor means for dividing the station ground voltage fall by the measurement of current to compute resistance in the ground to be tested.

2. The circuit for measuring resistance to ground on a telecommunications paired cable of claim 1 further comprising a display means for displaying the resistance in the ground to be tested.

3. The circuit for measuring resistance to ground on a telecommunications paired cable of claim 1 further comprising:
 a processor means for determining whether the computed resistance is above or below a predetermined threshold; and
 a display means for displaying whether the computed resistance is above or below the predetermined threshold.

4. The circuit for measuring resistance to ground on a telecommunications paired cable of claim 1 further comprising:
 a fifth electrical lead for connecting to a current rod removably inserted into the ground;
 a DC power supply;
 a second switch connection including a first condition where current is not flowing from said DC power supply to said first electrical lead connected to the ground to be tested and a second condition where current is flowing from said DC power supply to said first electrical lead connected to the ground to be tested;
 wherein said first measurement means further provides a third DC voltage measurement of voltage between the first lead connected to the ground to be tested and the fourth electrical lead connected to the voltage rod when the second switch connection is in the first condition and a fourth DC voltage measurement of voltage between the first lead connected to the ground to be tested and the fourth electrical lead connected to the voltage rod when the second switch connection is in the second condition;
 a third measurement means for providing a measurement of current flowing from the first electrical lead connected to the ground to be tested to the fifth electrical lead connected to the current rod when the second switch connection is in the second condition;
 a processor means for subtracting the fourth DC voltage measurement from the third DC voltage measurement to provide an alternate station ground voltage fall; and
 a processor means for dividing the alternate station ground voltage fall by the measurement of current provided by the third measurement means to compute resistance in the ground to be tested in the event that there is not sufficient current from the central office power supply to make a ground resistance measurement.

5. The circuit for measuring resistance to ground on a telecommunications paired cable of claim 1 further comprising:
 a third measurement means for measuring the voltage between the third lead connected to the tip side of a designated pair and the fourth electrical lead connected to the voltage rod when the switch connection is in the first condition to verify the voltage rod is adequately grounded.

6. A circuit for measuring resistance to ground on a telecommunications paired cable comprising:

a first electrical lead for connecting to a ground to be tested;

a second electrical lead for connecting to the ring side of a designated pair which returns to a central office power supply;

a third electrical lead for connecting to a voltage rod removably inserted into the ground;

a first switch connection including a first condition where loop current is not flowing from the central office power supply to the ground to be tested and including a second condition where loop current flows from the central office power supply to the ground to be tested;

a first measurement means for providing a first DC voltage measurement of voltage between the first lead connected to the ground to be tested and the third electrical lead connected to the voltage rod in the ground when the first switch connection is in the first condition and for providing a second DC voltage measurement of voltage between the first lead connected to the ground to be tested and the third electrical lead connected to the voltage rod in ground when the first switch connection is in the second condition;

a second measurement means for providing a measurement of current flowing from the first electrical lead connected to the ground to be tested to the second electrical lead connected to the ring side of a designated pair which returns to a central office power supply when the first switch connection is in the second condition;

a processor means for subtracting the second DC voltage measurement from the first DC voltage measurement to provide a station ground voltage fall; and a processor means for dividing the station ground voltage fall by the measurement of current provided by the second measurement means to compute resistance in the ground to be tested.

7. The circuit for measuring resistance to ground on a telecommunications paired cable of claim 6 further comprising a display means for displaying the resistance in the ground to be tested.

8. The circuit for measuring resistance to ground on a telecommunications paired cable of claim 6 further comprising:

a processor means for determining whether the computed resistance is above or below a predetermined threshold; and a display means for displaying whether the computed resistance is above or below the predetermined threshold.

9. The circuit for measuring resistance to ground on a telecommunications paired cable of claim 6 further comprising:

a fourth electrical lead for connecting to a current rod removably inserted into the ground;

a DC power supply;

a second switch connection including a first condition where current is not flowing from said DC power supply to said first electrical lead connected to said ground to be tested and a second condition where current is flowing from said DC power supply to said first electrical lead connected to the ground to be tested;

wherein said first measurement means further provides a third DC voltage measurement of voltage between the first lead connected to the ground to be tested and the third electrical lead connected to the voltage rod when the second switch connection is in the first condition and a fourth DC voltage measurement of voltage between the first lead connected to the ground to be tested and the third electrical lead connected to the voltage rod when the second switch is connection is in the second condition;

a third measurement means for providing a measurement of current flowing from the first electrical lead connected to the ground to be tested to the fourth electrical lead connected to the current rod when the second switch connection is in the second condition;

a processor means for subtracting the fourth DC voltage measurement from the third DC voltage measurement to provide an alternate station ground voltage fall; and a processor means for dividing the alternate station ground voltage fall by the measurement of current provided by the third measurement means to compute resistance in the ground to be tested in the event that there is not sufficient current from the central office power supply to make a ground resistance measurement.

10. The circuit for measuring resistance to ground on a telecommunications paired cable of claim 9, further comprising a fifth electrical lead for connecting to the tip side of the designated pair which returns to a central office ground.

11. The circuit for measuring resistance to ground on a telecommunications paired cable of claim 10, further comprising:

a fourth measurement means for measuring the voltage between the fifth lead connected to the tip side of a designated pair and the third electrical lead connected to the voltage rod when the first switch connection is in the first condition to verify the voltage rod is adequately grounded.

12. A circuit for measuring resistance to ground on a telecommunications paired cable including a designated pair having a tip side and a ring side in communication with a central office power supply comprising:

an analog to digital converter;

a first switch;

a first electrical lead electrically connected to a ground to be tested and to said first switch and to said analog to digital converter;

a second electrical lead electrically connected to the ring side of a designated pair which returns to a central office power supply and to said analog to digital converter through said first switch, said first switch including a first condition where loop current is not flowing from the central office power supply to the ground to be tested and including a second condition where loop current flows from the central office power supply to the ground to be tested;

a third electrical lead electrically connected to a voltage rod removably inserted into the ground and to said analog to digital converter through a voltage sensor;

a processor in communication with said analog to digital converter, said processor providing a first DC voltage measurement of voltage between the first lead connected to the ground to be tested and the voltage sensor when the first switch connection is in the first condition, a second DC voltage measurement of voltage between the first lead connected to the ground to be tested and the voltage sensor when the first switch connection is in the second condition, and a measurement of current flowing from the first electrical lead connected to the ground to be tested to the second electrical lead connected to the ring side of a designated pair which returns to a central office power supply when the first switch connection is in the second condition; and wherein said processor is configured to subtract the second DC voltage measurement from the first DC voltage measurement to provide a station ground voltage fall and to divide the station ground voltage fall by the measurement of current to compute resistance in the ground to be tested.

13. A circuit for measuring resistance to ground on a telecommunication paired cable of claim 12 further comprising:
a fourth electrical lead connected to a current rod removably inserted into the ground;
a DC power supply electrically connected to said current rod through a second switch and to said ground to be tested, said second switch including a first condition where current is not flowing from said DC power supply to said ground to be tested and a second condition where current is flowing from said DC power supply to said ground to be tested;
wherein said processor provides a third DC voltage measurement of voltage between the first lead connected to the ground to be tested and the voltage sensor when the second switch is in the first condition, a fourth DC voltage measurement of voltage between the first lead connected to the ground to be tested and the voltage sensor when the second switch is in the second condition, and a second measurement of current flowing from the first electrical lead connected to the ground to be tested to the fourth electrical lead connected to the current rod when the second switch is in the second condition; and
wherein said processor is configured to subtract the fourth DC voltage measurement from the third DC voltage measurement to provide and alternate station ground voltage fall; and to divide the alternate station ground voltage fall by the second measurement of current to compute resistance in the ground to be tested in the event there is not sufficient current from the central office power supply to make a ground resistance measurement.

14. The circuit of claim 13, further comprising a fifth electrical lead electrically connected to the tip side of the designated pair which returns to a central office ground.

15. A method of measuring ground resistance of an earth ground in communication with a selected pair of conductors in a telephone cable, the selected pair of conductors including a tip and a ring and in communication with a central office power supply, the method comprising the steps of:
providing a ground resistance tester having a first lead in communication with a known resistance, a second lead, a first switch in communication with said first and second leads, and a third lead in communication with a voltage sensor;
providing a removable stake;
attaching said third lead to said removable stake;
attaching said second lead to a ring of the selected pair of conductors;
attaching said first lead to the ground to be tested;
positioning said first switch in a closed position and determining whether sufficient current is flowing from the central office power supply to said known resistance to provide a ground resistance measurement;
if sufficient current is flowing, positioning said first switch to an open position to prevent current from flowing from the central office power supply to the ground to be tested and measuring a first voltage between said first lead and said voltage sensor;
positioning said first switch to a closed position to allow current to flow from the central office power supply to the ground to be tested and measuring a second voltage between said first lead and said voltage sensor;
determining the magnitude of a current flowing through said known resistance;
calculating a voltage fall by subtracting said second voltage from said first voltage; and
calculating a resistance of the ground to be tested by dividing said voltage fall by said magnitude of current.

16. The method of measuring ground resistance as defined in claim 15, further comprising the steps of:
providing a fourth lead in communication with a second switch;
providing a DC power supply in communication with said second switch, said ground to be tested and said known resistance;
attaching said fourth lead to a current rod positioned a sufficient distance from said ground to be tested and said removable stake;
if as a result of said step of positioning said first switch in a closed position to determine whether sufficient current is flowing from the central office power supply to said known resistance to provide a ground resistance measurement, it is determined that sufficient current is not flowing,
positioning said first switch in said open position and positioning said second switch in a first position where current is not flowing from said DC power supply to said first electrical lead and measuring a third voltage between the first lead and the fourth lead;
positioning said second switch in a second position where current is flowing from said DC power supply to said first electrical lead and measuring a fourth voltage between the first lead and the fourth lead;
determining the magnitude of a current flowing through said known resistance;
calculating an alternate voltage fall by subtracting said fourth voltage from said third voltage; and
calculating a resistance of the ground to be tested by dividing said alternate voltage fall by said magnitude of current.

17. The method of claim 15, further comprising the step of displaying the resistance of the ground to be tested.

18. The method of claim 15, further comprising the steps of determining whether the calculated resistance is above or below a predetermined threshold; and
activating an indicator to indicated whether said calculated resistance is above or below a predetermined threshold.

* * * * *